(12) United States Patent
Posseme et al.

(10) Patent No.: US 10,026,657 B2
(45) Date of Patent: Jul. 17, 2018

(54) METHOD FOR PRODUCING ON THE SAME TRANSISTORS SUBSTRATE HAVING DIFFERENT CHARACTERISTICS

(71) Applicant: Commissariat A L'Energie Atomique et aux Energies Alternatives, Paris (FR)

(72) Inventors: Nicolas Posseme, Sassenage (FR); Laurent Grenouillet, Claix (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 15/599,663

(22) Filed: May 19, 2017

(65) Prior Publication Data

US 2017/0338157 A1 Nov. 23, 2017

(30) Foreign Application Priority Data

May 20, 2016 (FR) ..................... 16 54556

(51) Int. Cl.
*H01L 21/8238* (2006.01)
*H01L 21/3115* (2006.01)
(Continued)

(52) U.S. Cl.
CPC ............ *H01L 21/823864* (2013.01); *H01L 21/31111* (2013.01); *H01L 21/31155* (2013.01); *H01L 21/32* (2013.01); *H01L 21/84* (2013.01)

(58) Field of Classification Search
CPC ......... H01L 21/28132; H01L 21/28141; H01L 21/02107; H01L 21/823864;
(Continued)

(56) References Cited

U.S. PATENT DOCUMENTS

| 2004/0232511 A1 | 11/2004 | Fujio et al. |
| 2006/0115988 A1 | 6/2006 | Lenski et al. |

(Continued)

FOREIGN PATENT DOCUMENTS

| EP | 2 750 170 | 7/2014 |
| EP | 2 876 677 | 5/2015 |

OTHER PUBLICATIONS

French Preliminary Search Report dated Jan. 17, 2017 ion French Application 16 54556, filed on May 20, 2016 ( with English Translation of categories of Cited Documents and Written Opinion).

*Primary Examiner* — Thanh T Nguyen
(74) *Attorney, Agent, or Firm* — Oblon, McClelland, Maier & Neustadt, L.L.P.

(57) ABSTRACT

A method is provided for producing at least one first transistor and at least one second transistor on the same substrate, including producing at least one first gate pattern and at least one second gate pattern on the substrate; depositing at least one first protective layer on the first and the second gate patterns; depositing, on the first and the second gate patterns, at least a first protective layer and a second protective layer overlying the first protective layer, the second protective layer being made from a different material than that of the first protective layer; masking the second gate pattern by a masking layer; isotropic etching of the second protective layer; removing the masking layer; and anisotropic etching of the second protective layer selectively relative to the first protective layer.

19 Claims, 6 Drawing Sheets

(51) Int. Cl.
*H01L 21/32* (2006.01)
*H01L 21/311* (2006.01)
*H01L 21/84* (2006.01)

(58) Field of Classification Search
CPC .......... H01L 21/31111; H01L 21/8238; H01L 21/311; H01L 21/3115; H01L 21/31155; H01L 21/32; H01L 21/84; H01L 21/046; H01L 21/0415; H01L 21/265
See application file for complete search history.

(56) References Cited

U.S. PATENT DOCUMENTS

| | | | |
|---|---|---|---|
| 2010/0193860 A1* | 8/2010 | Scheiper | H01L 21/266 257/327 |
| 2012/0319210 A1* | 12/2012 | Tsao | H01L 21/823814 257/392 |
| 2013/0095630 A1* | 4/2013 | Eshun | H01L 21/823412 438/302 |
| 2013/0149854 A1 | 6/2013 | Ishii et al. | |
| 2014/0077310 A1 | 3/2014 | Ishii et al. | |
| 2014/0113425 A1* | 4/2014 | Liu | H01L 21/823412 438/302 |
| 2014/0187046 A1 | 7/2014 | Posseme et al. | |
| 2014/0206170 A1* | 7/2014 | Lee | H01L 21/26586 438/302 |
| 2014/0273292 A1 | 9/2014 | Posseme et al. | |
| 2015/0162190 A1 | 6/2015 | Posseme | |
| 2015/0200270 A1* | 7/2015 | Flachowsky | H01L 29/66575 257/338 |
| 2015/0221555 A1* | 8/2015 | Chiang | H01L 21/823418 257/391 |
| 2016/0284549 A1* | 9/2016 | Nguyen | H01L 21/26506 |
| 2016/0300709 A1 | 10/2016 | Posseme et al. | |
| 2017/0062438 A1* | 3/2017 | Moll | H01L 27/1104 |

\* cited by examiner

METHOD FOR PRODUCING ON THE SAME TRANSISTORS SUBSTRATE HAVING DIFFERENT CHARACTERISTICS

TECHNICAL FIELD OF THE INVENTION

This invention relates to the production on the same substrate of transistors having different characteristics, for example gate oxides of which the thicknesses are different. It will have for advantageous application the production of such transistors on a substrate of the FDSOI type.

PRIOR ART

For certain circuits, it is necessary to produce on the same developed substrate, also designated as a wafer, transistors having different characteristics, for example different gate oxide thicknesses.

Developed substrates generally comprise a support substrate overlaid with an oxide layer and a semi-conductor layer of which the thickness is thin. They are qualified as FDSOI (fully depleted silicon on insulator) or PDSOI (partially depleted silicon on insulator) according mainly to the thickness of the semiconductor layer.

The transistors that are produced on this type of developed substrates have a gate stack comprising in particular a gate usually made of doped silicon or of metal, a metal layer and an electrically insulating layer referred to as gate oxide located between the active layer and the gate made of polycrystalline silicon.

On the same developed substrate, it is possible to produce transistors of a first type having a characteristic that is different from that of a second type of transistor. For example it is possible to produce, on the same substrate, transistors of a first type having a first gate oxide thickness and transistors of a second type having a second gate oxide thickness greater than the first thickness so as to operate at higher voltages.

In order to limit the complexity of the method, many steps are common to the production of the two types of transistors of which in particular the production of the metal layer, the gate made of polysilicon, the spacers, the sources and drains.

This invention has for objective to propose a solution in order to integrate in a reproducible and simple manner, on the same substrate, transistors having different characteristics, for example gate oxides of which the thicknesses are different.

SUMMARY OF THE INVENTION

In order to achieve this objective, according to an embodiment this invention provides a method for producing on the same substrate for example of the semiconductor-on-insulator type of at least one first transistor and of at least one second transistor, with the method comprising at least the following steps:
Production on a substrate for example of the semiconductor-on-insulator type of at least one first gate pattern and of at least one second gate pattern;
Deposition on the first and the second gate pattern of at least one first protective layer;
Masking of the second pattern by a masking layer;
After the step of masking: isotropic modification of the first protective layer located on the first pattern by isotropic implantation of ions in the first protective layer in such a way as to form modified portions of the first layer; with the second pattern being masked by the masking layer during this isotropic modification;
Removal of the masking layer;
Before the step of masking or after the step of removing the masking layer: anisotropic modification of the first protective layer by anisotropic implantation of ions in the first protective layer, with the anisotropic implantation being carried out according to a privileged direction parallel to the flanks of the second pattern in such a way as to modify the first protective layer at least on a top of the second pattern and outside of the first and second patterns while still retaining non-modified portions of the first protective layer on the flanks of the second pattern;
Selective etching of the modified portions of the first protective layer selectively to the non-modified portions of the first protective layer.

As such, the method according to the invention makes it possible to produce on the flanks of the second pattern spacers of a thickness that is more substantial than on the flanks of the first pattern.

This invention as such proposes a solution in order to integrate in a reproducible and simple manner, on the same substrate, transistors having different characteristics.

It offers a particularly interesting advantage for the production on the same substrate of transistors of which the gate stacks have insulating layers, typically gate oxides, of which the thicknesses are different. In practice, it was observed that with the known solutions, very often the performance of the transistors of which the gate oxides are thicker are degraded as they are used.

Consequently, with the known solutions, the performance and the service life of devices comprising these transistors can represent a barrier to the industrialization thereof.

In the framework of developing this invention, it was observed that with the known solutions, in the transistor having a gate stack of which the thickest gate oxide, the electrical field is the highest at the interface between source/drain and spacers, not on the gate oxide, as was foreseeable.

This strong electrical field can drive the breakdown of the spacer as the transistor operates.

By providing a thicker spacer on the flanks of the gate of the second transistor which has to support higher voltages, the invention makes it possible to suppress this risk of breakdown.

Moreover, the invention makes it possible to retain on the flanks of the gate of the first transistor a thin spacer thickness.

The invention as such makes it possible to retain the performance of transistors of which the gate oxides are the thinnest.

Furthermore, the invention has a limited complexity in relation to conventional solutions wherein the gate spacers on the flanks of the first and second transistors are of identical thicknesses. In particular the method according to the invention does not require an additional lithography mask. In particular, advantageously, the mask level that makes it possible to introduce the difference in thickness over the spacer is the same as that for inducing the gate oxide difference.

Furthermore this method does not require any additional over-etching which could deteriorate the active layer.

The method according to the invention is as, such compatible with the subsequent steps which are conventional in order to finalize the production of the transistors.

As such, the invention offers a solution t-hat is effective, easy to industrialize and in expensive for improving the performance and the service life of devices having different characteristics, for example of transistors of which the gate oxides have different thicknesses.

Elle is particularly advantageous for the production of FDSOI transistors. The invention however applies in particular to transistors formed on bulk substrates or on substrates of the PDSOI type.

Optionally, the invention can furthermore have at least any one of the following optional characteristics:

According to an embodiment, the first gate pattern is a first gate stack, and the second gate pattern is a second gate stack.

According to another embodiment, the first gate pattern is a sacrificial pattern and the second pattern is a sacrificial pattern. The method comprises, after said step of selective etching of the modified portions, a step of replacing the first and second sacrificial patterns with patterns forming respectively a first gate stack and a second gate stack.

According to another embodiment, each one of the first and second gate stacks comprises at least one insulating layer typically a gate oxide, with the thickness of the insulating layer of the second stack being greater than the thickness of the insulating layer of the first stack.

According to an embodiment, the thickness of the gate oxide of the first stack is between 0 and 3 nm ($10^{-9}$ meters) and preferably between 0 and 1.5 nm.

According to an embodiment, the thickness of the gate oxide of the second stack is between 1.5 and 8 nm, more preferably between 2 and 6 nm and preferably between 2 and 3.5 nm.

According to an embodiment the gate pattern is intended to form a gate for the transistor. The gate pattern is then functional. This is then a method that can be qualified as "gate first", i.e. wherein the gate is produced first. According to another embodiment, the gate pattern is intended to be removed, after having formed the spacers, to then be replaced with a functional gate pattern. The gate pattern is then sacrificial. This is then a method that can be qualified as "gate last", i.e. wherein the gate is produced in a second step.

According to an embodiment, the method comprises, after the step of selective etching, a step of forming of at least one additional layer on the flanks of the spacers of the first and second patterns.

According to an embodiment, the thickness of said additional layer is identical on the flanks of the spacers of the first and second patterns.

According to an embodiment, the anisotropic modification of the first protective layer by anisotropic implantation of ions in the first protective layer is carried out before the step of masking. Alternatively, the anisotropic modification of the first protective layer by anisotropic implantation of ions in the first protective layer is carried out after the step of removing the masking layer.

According to an embodiment, the substrate comprises an active layer located under the first and second gate patterns and said selective etching is carried out in such a way as to etch the modified portions of the first protective layer selectively to the active layer.

According to an embodiment, the first protective layer is made of nitride, preferably of silicon nitride (SiN). Alternatively, the first protective layer of a material of which the dielectric constant is less than 7 and is preferably taken from the following materials: a material with a base of carbon (C), SICCA, SiC, SiCN, SiOCN, SiCBN, SiOCH, CBN, BN, SiCBO and SiO2.

According to an embodiment, the protective layer is a porous layer. Alternatively, the protective layer is a non-porous layer.

According to an embodiment, at least one among the insulating later of the first pattern and the insulating later of the second pattern is a gate oxide layer.

Moreover, optionally, the invention can furthermore have at least one of any of the following additional characteristics:

According to an embodiment, the isotropic modification of the first protective layer by isotropic implantation of ions in the first protective layer is carried out using an implanter and by modifying a direction of bombardment during the implantation.

Alternatively, the isotropic modification of the first protective layer is carried out by isotropic implantation of ions coming from a plasma.

According to an embodiment, the implanted ions are helium ions or ions with a hydrogen base. According to an embodiment, during the isotropic modification a pressure greater than 100 milli Torr is maintained.

This makes it possible to render the implantation more isotropic.

According to an embodiment, the anisotropic modification of the first protective layer by anisotropic implantation of ions in the first protective layer is carried out using an implanter and by retaining a substantially constant direction of bombardment during the implantation, with this direction being substantially parallel to the flanks of the second pattern.

According to an embodiment, the ions implanted during the anisotropic modification are taken from among one or several of the following species: argon (Ar) and fluorine (F).

Alternatively the anisotropic modification of the first protective layer is carried out by anisotropic implantation of ions coming from a plasma.

According to an embodiment, the implanted ions are helium ions or ions with a hydrogen base. According to an embodiment, during the anisotropic modification a pressure less than 100 milli Torr is maintained.

This makes it possible to prevent a deflection of the ions which would be detrimental to the anisotropy of the implantation.

According to an embodiment, said anisotropic modification of the first protective layer comprises the following steps: putting into presence of the protective layer with a plasma formed used a gaseous mixture formed of at least one first non-carbon gaseous component of which the dissociation generates the light ions and a second gaseous component comprising at least one species favoring the dissociation of the first component in order to form the light ions. According to an embodiment, the gas ratio between the first component and the second component is greater than 1:19 and less than 19:1.

The adding of a second component that acts advantageously as a dissociation gas (such as argon, helium, xenon, nitrogen), makes it possible to facilitate the dissociation of the first component and in this way, to favor the implantation of said first dissociated component in the protective layer 500, in the form of light ions.

Preferably, said ratio is between 1:9 and 9:1.

The characteristics hereinabove can be applied to an isotropic modification if the pressure is sufficient in order to obtain an isotropy of the modification.

Moreover, also optionally, the invention can furthermore have at least one of any of the following optional characteristics:

According to an embodiment, said selective etching is a wet etching using a solution with a base of hydrofluoric acid (HF) and/or using a solution with a base of phosphoric acid ($H_3PO_4$).

Alternatively, said selective etching is a dry etching, more preferably carried out in a plasma formed using nitrogen trifluoride ($NF_3$) and ammonia ($NH_3$). According to an embodiment, the dry etching comprises: a step of etching consisting in the formation of solid salts; a step of sublimation of the solid species.

Alternatively, said selective etching comprises:

a dry etching carried out by putting into presence of modified portions of the first protective layer with a gaseous mixture, more preferably only gaseous, comprising at least one first component with a base of hydrofluoric acid (HF), with the hydrofluoric acid transforming the modified dielectric layer into non-volatile residue at ambient temperature, only after the dry etching: a removal of the non-volatile residues at ambient temperature by a wet cleaning or by sublimation thermal annealing.

Another aspect of this invention relates to a microelectronic device comprising on the same substrate of the semiconductor-on-insulator type at least one first transistor and at least one second transistor each having a gate pattern and spacers located on flanks of the patterns, with each gate pattern comprising a stack comprising at least one gate and one insulating layer located between the gate and an active layer of said substrate. The insulating layer of the gate stack of the second transistor has a thickness that is greater than that of the first transistor. The spacers of the second transistor are thicker than the spacers of the first transistor.

The term microelectronic device means any type of device produced with the means of microelectronics. These devices encompass in particular in addition to devices with a purely electronic finality, micromechanical or electromechanical devices (MEMS, NEMS . . . ) as well as optical or optoelectronic devices (MOEMS . . . ).

Optionally, the substrate is of the FDSOI, PDSOI or bulk type.

The other objects, characteristics and advantages of this invention shall appear when examining the following description and the accompanying drawings. It is understood that other advantages can be incorporated.

BRIEF DESCRIPTION OF THE FIGURES

The purposes and objects as well as the characteristics and advantages of the invention shall appear better in the detailed description of an embodiment of the latter which is shown in the following accompanying drawings wherein.

The drawings are provided by way of example and do not limit the invention. They form block diagrams intended to facilitate the understanding of the invention and are not necessarily to the scale of the practical applications. In particular the relative thicknesses of the various layers and films do not represent reality.

DETAILED DESCRIPTION OF THE INVENTION

It is specified that in the framework of this invention, the terms "on", "overlaid", "covers" or "underlying" or the equivalents thereof do not necessarily means "in contact with". As such for example, the deposition of a first layer on a second layer, does not necessarily mean that the two layers are directly in contact with one another but this means that the first layer covers at least partially the second layer by being either directly in contact with it or by being separated from it by at least one other layer or at least one other element.

In reference to the FIGS. 1 to 9, an example of the method according to the invention shall now be described.

Figure 1:
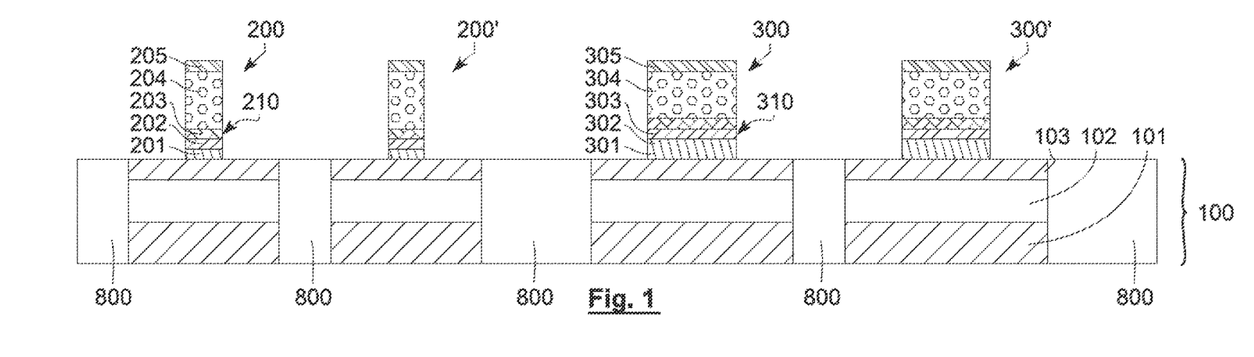
FIG. 1 diagrammatically shows a developed substrate comprising gate patterns of which the dielectric layers have different thicknesses.

FIG. 1 shows a structure starting from which the steps of the method according to the invention are implemented. This structure comprises transistors in the process of being formed.

This structure comprises:

a developed substrate 100 of the semiconductor-on-insulator type (SOI). In the example shown this developed substrate successively comprises a support layer 101; for example made of monocrystalline, polycrystalline or amorphous silicon; a dielectric layer 102, usually qualified as buried oxide (BOX) and a semiconductor active layer 103 intended to form a conduction channel of a transistor. The latter is for example made of silicon (Si), of germanium (Ge) or of silicon-germanium (SiGe), preferably monocrystalline.

gate patterns 200, 200', 300, 300'. In the example shown, which is not limiting, the gate patterns 200, 200', 300, 300' each form a stack of several couches. These patterns 200, 200', 300, 300' are intended to be retained in the final transistors (method of the gate first type). According to an alternative embodiment not shown, the gate patterns 200, 200', 300, 300' are sacrificial patterns which are intended to be removed after production of the spacers, then to be replaced with another gate forming more preferably a stack (method of the gate last type). The invention covers this alternative embodiment.

In the rest of the description, which shows an embodiment of the gate first type in reference to the figures, the term stack as well as pattern will be used.

Typically, the gate stacks each include at least one gate 204, 304 usually made from polycrystalline silicon or from metal and an insulating layer 201, 301 usually qualified as gate oxide located under the gate 204, 304 and through which an electrical field will be able to develop in order to create an underlying conduction channel between source and drain when a sufficient voltage is applied to the gate 204, 304.

In the example shown, the transistors formed using patterns 200 and 300 will be of the NFET type and the transistors formed using patterns 200' and 300' will be of the PFET type. This example naturally does not limit the relative arrangement of transistors of type N and P. In the rest of the description and for reasons of concision, only one of the two types of transistors (NFET in the examples shown) will be described and referenced in the figures. The steps described in reference to the FIGS. 1 to 9 will however be applicable to transistors of the N type as well as to transistors of the P type.

Preferably, each gate stack 200, 200', 300, 300' also comprises:
- a metal layer often qualified as a metal gate 203, 303 and located between the gate 204, 304 and the gate oxide insulating layer 201, 301;
- a dielectric layer 202, 302, also qualified as a high permittivity layer or also called "high-k", i.e. made from a material with high permittivity. This layer is located between the gate oxide insulating layer 201, 301 and the metal gate 203, 303.
- a hard protective mask 205, 305 which will be removed afterwards in order to allow for the resumed contact on the gate 204, 304. This hard mask 205, 305, which remains in place after the etching of the gate 204, 304, is typically made of silicon oxide ($SiO_2$) or of silicon nitride (SiN). Its role is to protect the top of the gate 204, 304 from any damage during the carrying out of the following steps and in particular those of etching spacers. A thin layer of oxide can be found between the polycrystalline silicon of the gate and the hard nitride mask.

Preferably, the gate oxide insulating layer 201, 301 is arranged directly in contact with the active layer 103 that forms the conduction channel and directly in contact with the layer with high permittivity 202, 302. Preferably, the metal layer 203, 303 is arranged directly in contact with the layer with high permittivity 202, 302 and directly in contact with the gate 204, 304.

According to another embodiment the metal layer 203, 303 and/or the layer with high permittivity 202, 302 are absent.

The same developed substrate 100 supports a plurality of transistors and therefore of gate stacks. For certain applications, it is necessary to have transistors of which the properties are different. As such, certain transistors have to have a gate oxide insulating layer 301 of which the thickness is more substantial than that of the gate oxide insulating layer 201 of other transistors.

FIG. 1 as such shows gate stacks 300, 300' of which the thickness of the insulating layer 301 is greater than that of the insulating layer 201 of the stacks 200, 200'.

By way of a non-limiting example, it is as such possible to have on the same developed substrate 100:
- transistors of which the gate oxide insulating layer has a thickness between 0 and 1.5 nm. These transistors are known to operate at a voltage Vdd between 0.8V and 1V. These transistors are sometimes qualified as SG or as G01, without this name being limiting.
- The thickness of the spacers is measured perpendicularly to the plane containing the flanks 210, 310 of the gates 204, 304, i.e. in this example, according to a direction parallel to the main plane wherein the substrate 100 extends. This thickness is therefore measured horizontally in the FIGS. 1 to 9.
- transistors of which the gate oxide has a thickness between 2 and 5 nm, and more often between 2 and 3.5 nm. These transistors are known to operate at a voltage Vdd between 1.5V and 3.5V. As such the breakdown voltage for these transistors is higher than the maximum voltage applied to the gate oxide. These transistors are sometimes qualified as EG or G02, without this name being limiting.
- transistors of which the gate oxide has a thickness between 3 and 6 nm are known to operate at a voltage Vdd greater than 3V. As such the breakdown voltage for these transistors is higher than the maximum voltage applied to the gate oxide. These transistors are sometimes qualified as ZG or G03, without this name being limiting.

The structure shown in FIG. 1 shows also the presence of an insulating trench 800 that passes through the entire active layer 103 in order to insulate two adjacent transistors. These insulating trenches 800 extend through the entire thickness of the active layer 103 and until in the support layer 101. These insulating trenches are typically made from SiO2.

Figure 2:
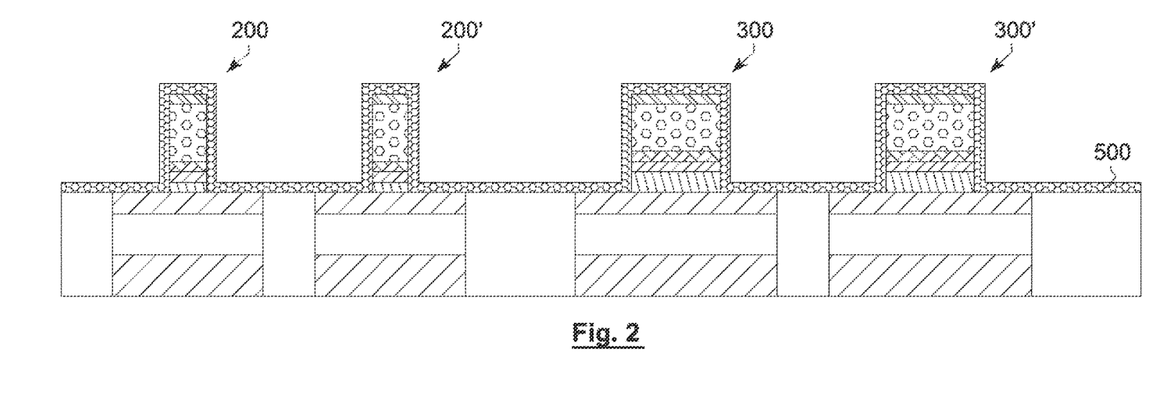
FIGS. 2 to 9 show the steps of an embodiment of the method according to the invention.

FIG. 2 shows a following step during which a conformal protective layer 500 is formed intended to form spacers on the flanks 310 of the stacks 300, 300'.

This first protective layer 500 is a single layer on this embodiment. However, it could be formed from a plurality of layers.

Typically, for transistors of which the gate oxides 301 have a thickness of about 3 to 5 nm, the total thickness of this protective layer 500 more preferably has a thickness between 3 and 10 nm and preferably between 4 and 6 nm.

Moreover, in order to limit the complexity of the methods and to limit the cost thereof, it is preferable that the spacers of transistors of two different types be produced during the same steps.

This results in that, in the known methods, the spacers of transistors having thicker gate oxides are also less than 9 nm.

In the framework of the development of this invention, it was identified that this thickness often results in a breakdown on the spacers of transistors with a thick gate oxide, therefore deteriorating the reliability and the service life of the devices that integrate this type of transistors.

The steps that follow make it possible to overcome this problem by forming thicker spacers on the flanks 310 of the stacks 300 of which the insulating layer 301 is thicker, while still limiting the complexity of the method.

This protective layer 500 shown is for example made of nitride, such as silicon nitride (SiN).

It can be made of a porous or non-porous material. In the framework of this invention, porous layer designates a layer wherein the presence of a void is greater than 5% and preferably between 5 and 10%.

Alternatively, the layer 500 can be made of a low-k material, i.e. with low permittivity. Its permittivity is less than 7 and preferably less than 4. It then comprises more preferably at least one of the following species or a combination of these species: silicon (Si), carbon (C), boron (B), nitrogen (N), hydrogen (H). It is for example formed in one of the following materials: SiCO, SiC, SiCN, SiOCN or SiCBN. This low-k layer is porous or not.

The dielectric constant of these layers is measured for example with the conventional method referred to as the mercury drop method.

The protective layer 500 is obtained by a conformal deposition, i.e. it has a constant thickness over the entire wafer and in particular on the flanks 210, 310 and the tops 220, 320 of the gate stacks 200, 200', 300, 300' as well as outside of these gate stacks.

Figure 3:
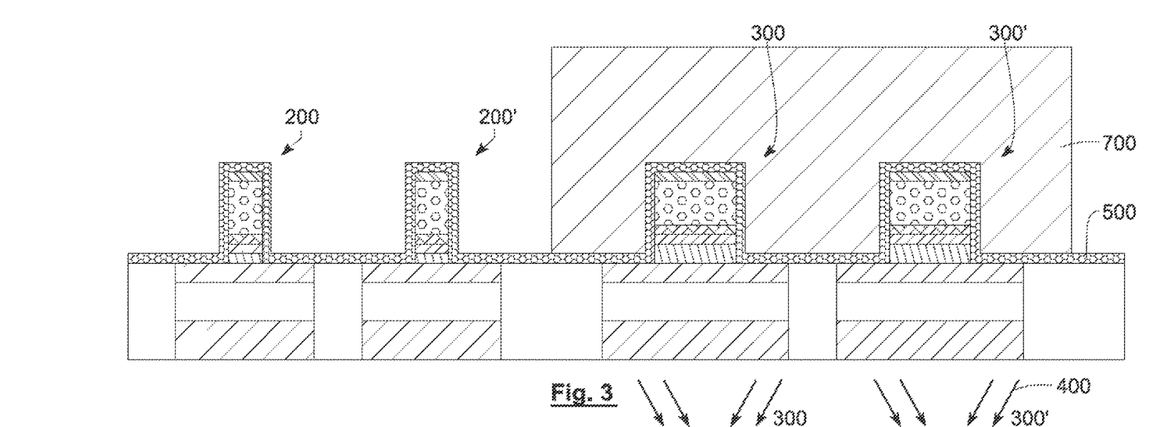

FIG. 3 shows a following step during which a masking layer is formed 700 is order to entirely cover the second gate stack 300 (and therefore also the stack 300' in this example), i.e. the one having an insulating layer thickness (for example gate oxide) 301 greater than that of the first stack 200. This masking layer 700 is typically a layer with a base of carbon, preferentially resin, with full wafer deposition, then opened on first stack 200 by one of the conventional techniques of lithography.

In the framework of this invention, an organic or organomineral material that can be formed via an exposure to a beam of electrons, photons or X rays or mechanically is qualified as a resin.

Figure 4:
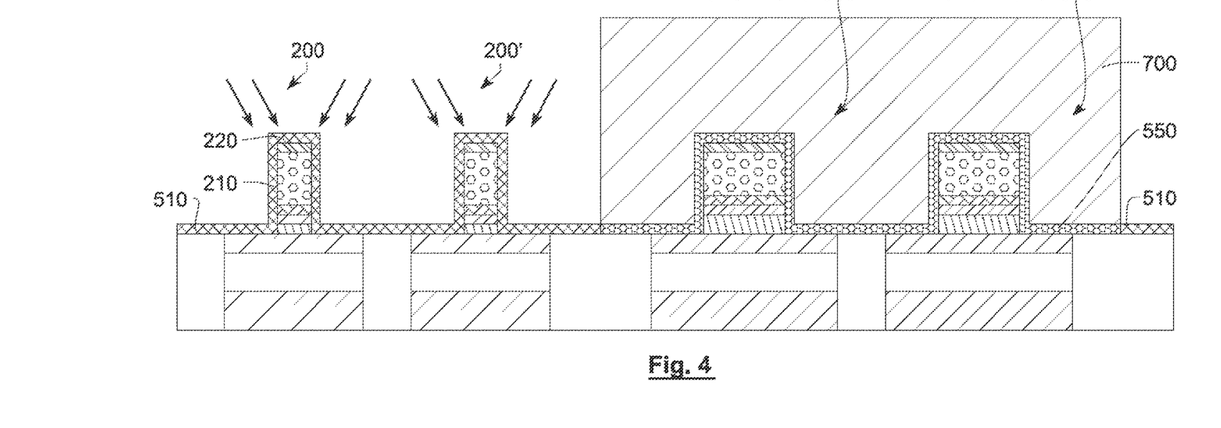

The step shown in FIG. 4 aims to isotropically modify the first protective layer 500 on the first stacks 200, 200'. To this effect, this step of modification comprises at least one anisotropic implantation 400 of ions in the layer 500, more preferably in the entire thickness of the latter.

This implantation 400 of ions is carried out preferably full wafer. The first layer 500 covering the stacks 300, 300' is not modified because it is protected by the masking layer 700.

This isotropic implantation 400 makes it possible to modify the protective layer 500 without however pulverizing it. As such, this is substantially a chemical modification, with the adding of ions in this layer 500 changing the etching selectivity of this layer 500. As such, the modified portions 550 will be etched much more easily than the non-modified portions 510.

The implantation can be carried out:
in a conventional implanter, (beamline), i.e. with an implantation by a beam of ions:

An advantage procured by the use of an implanter is the possibility of modifying the protective layer 500 on the flanks 210 of the first stack 200 by bombarding according to several inclinations (tilt) the direction of implantation.

For this type of implantation, recourse will be had for example to the following species in order to modify the protective layer 500: argon (Ar), fluorine (F), oxygen (O) or hydrogen (H). The angle of inclination of the implantation will be adapted as well as the energy of the ions according to the density and the shape of the patterns formed by the stacks 200 of the masking layer 700, as well as according to the thickness of the protective layer 500.

Typically, the dose implanted by a beam of ions is greater than $1^E15$ atoms per square centimeter (at/cm$^2$).

These implantation conditions are for example determined by simulation by using simulation tools of the SRIM type (stopping and range of ions matter) or TRIM (transport simulation of ions in matter). These simulation tools can also be used to determine the implantation conditions for implantations by plasma of which details will be provided hereinbelow.

in piece of plasma etching equipment. In this case, a capacitive coupling plasma reactor (CCP) or an inductive coupling plasma reactor (ICP), or a plasma via immersion can be used.

The implantation of ions by plasma is an advantageous solution, in particular since it makes it possible to control with precision the implanted depth so as to:
implanter and therefore modify the entire thickness of the protective layer 500;
to not implant the underlying layers, in particular the active layer 103 and the gate 204.

Moreover, the interest of the plasma is that there is a chemical modification in particular by H implantation, which makes removing the modified layer easier.

According to an embodiment, this modification comprises the implantation of ions with a base of hydrogen (H, H$^+$, H$_2^+$, H$_3^+$, etc. . . . ).

According to another embodiment the implanted ions are ions of helium (He) or a mixture of ions of helium and of hydrogen (H/He).

These ions can come for example from the following gases introduced into the reactor: H$_2$, HBr; NH$_3$.

In order to obtain an isotropic modification by implantation by plasma it is possible to play with several parameters:

pressure. More preferably it is greater than 100 milli Torr. This makes it possible to have a deflection of ions in order to reach the flanks 204 of the stacks 200, 200'.

temperature. It is preferably less than 100° C. which makes it possible to more effectively modify the protective layer 500. It has been observed that beyond 100° C. the implanted H ions desorb which lessens the expected effect of the modification.

species implanted. The ions with a base of H and He allow for an implantation of the protective layer 500 without pulverization of the latter and without deposition on the surface of the latter.

It is also possible to pulse the polarization voltage (bias) and/or the source in such a way as to accentuate the isotropic effect.

At the end of this step of implantation, all of the protective layer 500 that is not covered by the masking layer 700 is modified, more preferably over the entire thickness thereof. As such a modified layer 550 is formed, both on the top 220 ands the flanks 210 of the stacks 200, 200' as well as between these stacks 200, 200'.

Figure 5:
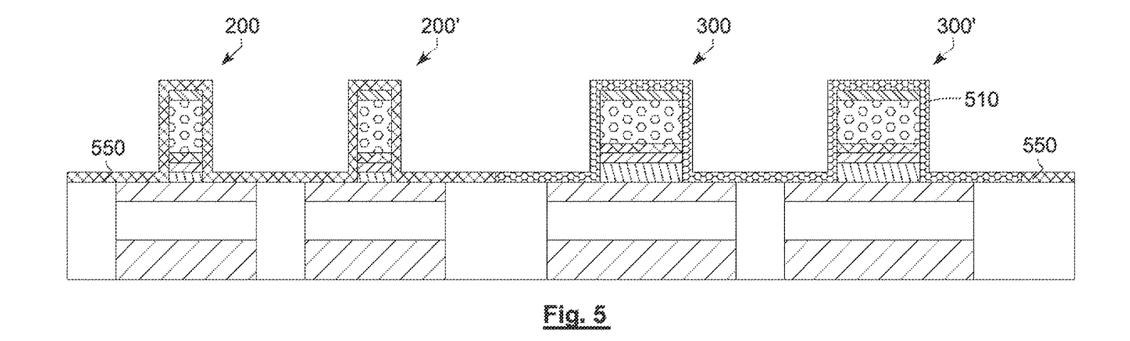

As shown in FIG. 5, the masking layer 700 is then removed. Naturally, this removal is selective of the material of the first modified layer 550 so as to retain the latter on the first stack 200. When this masking layer 700 is a photosensitive resin, it is for example removed in a capacitive coupling reactor, or inductive coupling, or microwaves by using an oxidant chemistry (with a base of O$_2$) or reducing chemistry (with a base of H$_2$). For example, a gaseous mixture of N$_2$ and H$_2$ can be injected into a plasma reactor for the etching, then carry out a wet cleaning in order to remove the resin residues. This cleaning can be carried out using a solution SC1 (NH$_4$OH—H$_2$O$_2$).

At this stage, the initial thickness of the first layer 500 is retained in its entirety on the stacks 300, 300'. It is modified over all or a portion of its thickness on the stacks 200, 200'.

Figure 6:
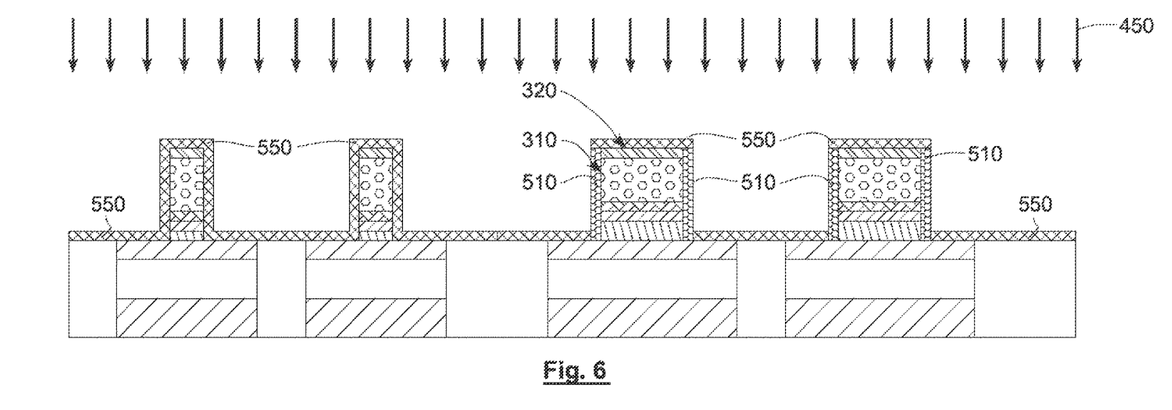
Figure 7:
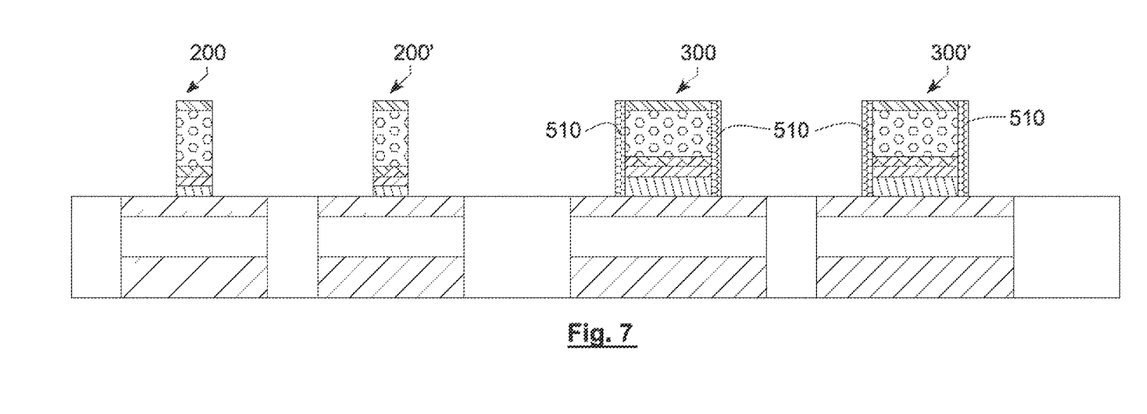

FIGS. 6 and 7 aims to modify and anisotropically etch the first protective layer 500 on the stacks 300, 300' in order to suppress or reduce the thickness of this layer 500 on the top 320 of the second stacks 300, 300' while still retaining a substantial thickness of this layer 500 on the flanks thereof 310 and without substantially altering the active layer 103.

FIG. 6 shows a step of anisotropic modification of the protective layer 500 by implantation 450 of ions within this layer according to a privileged direction. This direction is parallel to the flanks 310 of the two stacks 300, 300'. In the example shown, this direction is perpendicular to the main plane wherein the substrate 100 extends, i.e. a vertical direction in this FIG. 6.

As with the isotropic implantation 400, this anisotropic implantation makes it possible to modify the protective layer 500 without however pulverizing it. As such, this is substantially a chemical modification of the layer 500, with the adding of ions in this layer 500 changing the selectivity of the etching of the modified portions 550 in relation to the non-modified portions 510 of this protective layer 500.

This modification can be carried out by implantation using an implanter or using a plasma. Details on these two embodiments and their alternatives are provided hereinbelow:

1. Implantation by Conventional Implanters

A first embodiment consists in implanting ions using implanters usually qualified as "beamline". Contrary to the isotropic modification, the angle of implantation remains constant all throughout the implantation. This inclination is parallel to the flanks 310 of the stacks 300, 300' covered with the non-modified protective layer 500.

For this type of implantation, the protective layer 500 is for example made of nitride, such as silicon nitride (SiN).

Alternatively, the material of the protective layer is taken from among: SiCO, SiC, SiCN, SiOCN, SiCBN, SiCBO, SiOCH, cBN (cubic boron nitride) and $SiO_2$. The protective layer 500 can be made from a porous or non-porous material. It has a dielectric constant preferably less than 7.

The implanted species can be argon (Ar), fluorine (F), oxygen (O) or hydrogen (H). These species allow for a precise implantation.

In the following step, the modified portions 550 of the protective layer 500 can as such be removed by dry etching and selectively with respect to the non-implanted portions 510 and to the active layer 103.

2. Implantation Using a Plasma

Another embodiment consists in implanting in the protective layer 500 ions coming from a plasma. Preferably, the implanted ions are light ions. The term "light ions" refers to ions coming from materials of which the atomic number in the periodic table of elements is low. Generally all of the elements that can be implanted in the material to be etched, without provoking a dislocation in, its atomic structure such that it would result in a pulverization of the latter, and therefore without deposition of material etched on the walls of the reactor or the patterns in the process themselves of being etched, can be suitable.

Preferably, the implanted ions are light ions such as ions of helium (He) or ions with a base of hydrogen (H, $H^+$, $H_2^+$, $H_3^+$, etc. . . . ) of which the atomic numbers are respectively 1 and 2. More generally, the light ions are taken from among the species of which the atomic number is less than or equal 10. A single or several of these species can be implanted.

a. First Embodiment by Implantation by Plasma

The modification of the layer of nitride by implantation 450 of light ions makes it possible to substantially improve the selectivity of the modified protective layer 550 with respect to the semiconductor material of the active layer 103, typically silicon and with regards to the non-modified protective layer 510.

The etching which is then carried out in the following step shown in FIG. 7 as such consumes the modified protective layer 550 preferentially to the active layer 103 of semiconductor material and to the non-modified protective layer 510. As such, the risk of excessive consumption of the superficial active layer 103 of semiconductor material is reduced and even suppressed.

Preferably, the modification of the protective layer 500 retains all or a portion of the thickness of the layer 500 on the flanks of the gate 304. This thickness is retained, at least partially, during the selective etching. It then defines spacers for the gate stack 300, 300'.

This method of modification of the protective layer 500 as such allows for the deposition of a thickness that is thicker than desired in the end on the flanks 310, then to reduce this thickness by implanting ions from the surface of the layer 500 located on the flanks 310 and through a portion only of the thickness of the layer 500. As such the thickness of the portion 510 that covers the gate 304 is precisely controlled, while still avoiding having to carry out a very fine deposition of the initial layer 500.

Moreover, this embodiment makes it possible to obtain spacers of nitride or of low-k material of which the thickness is precise while still reducing and even eliminating the problems of known solutions such as the formation of "roots" or the excessive consumption of the active layer 103 at the base of the gate.

The implantation by plasma has for advantage to allow for an implantation continuously in a volume extending from the surface of the implanted layer.

Furthermore using a plasma allows for an implantation at depths that are shallower than the minimum depths that can be obtained with implanters. As such, an implantation by plasma makes it possible to effectively implant and in a relatively homogeneous way or at the least in a continuous manner thin thicknesses which can then be removed by a selective etching. This continuity of implantation from the implanted face makes it possible to improve the homogeneity of the modification according to the depth, which leads to a constant etching speed over time of the implanted layer. Moreover, the increase in the electivity conferred by the implantation with respect to the other layers is effective right from the beginning of the etching of the implanted layer. The implantation by plasma as such allows for substantially improved control of the etching precision.

The implantation plasma typically makes it possible to implant then to remove thicknesses extending from the surface of the implanted layer and over a depth ranging from 0 nm to a few nm, which is advantageous for precisely controlling the implantation in layers that are as thin as those deposited in order to form the spacers.

Using a plasma to modify the layer to be removed is therefore particularly advantageous since it is desired to not entirely remove the protective layer 500 on the flanks or to remove a thin and carefully controlled thickness, typically between 1 nm and 5 nm and more generally between 1 nm and 30 nm.

The step of modification carried out using a plasma modifies the protective layer 500 continuously from the surface of the protective layer 500 and over a thickness between 1 nm and 30 nm and preferably between 1 nm and 10 nm.

According to a particular advantageous embodiment, the implantation and the later removal of the protective layer 500 are carried out in the same plasma reactor. A modification of the layer 500 to be removed carried out by an implantation by plasma as such makes it possible to carry out the modification of the layer and the etching in the same chamber which is very advantageous in terms of simplification, time and cost of the method.

Also advantageously, the modification of the protective layer 500 by implantation of light ions such as hydrogen (H2) or helium (He) also makes it possible to improve the selectivity of this modified protective layer 550 in relation to the oxide of the semiconductor material. Typically, the modified protective layer 550 is removed while the gate oxide and the trenches 800 are not consumed or are consumed less.

Optionally, this method can furthermore have at least one of any of the characteristics and steps hereinbelow:

Advantageously, the implantation is carried out in such a way as to modify the entire thickness of the protective layer 500 outside of the protective layer 500 arranged on the flanks 310 of the gate 304. As such, the etching removes all of the protective layer 500 except for a portion at least of the protective layer 500 located on the flanks 310 of the gate 304.

Advantageously, the thickness of the modified protective layer 550 on the flanks 310 of the gate 304 is zero or is less than the thickness of the protective layer 500 before modification by implantation.

Preferably, the implantation modifies the protective layer 500 uninterruptedly from the surface.

According to a particular embodiment, the method comprises a single step of modification carried out in such a way as to modify the protective layer 500 over its entire thickness over all of the surfaces parallel to the plane of a substrate 100 whereon the gates 304 rest and to not modify the protective layer 500 over its entire thickness on the surfaces perpendicular to this plane.

According to another embodiment, the method comprises several sequences with each one comprising a step of modification and a step of removal. During at least one of the steps of modification, only a portion of the thickness of the protective layer 500 is modified. Advantageously, the sequences are repeated until the protective layer 500 disappears over all of the surfaces parallel to the plane of the substrate 100 whereon the gate 304 rests. Only the faces parallel to the flanks 310 of the gate 304 retain a thickness of, the protective layer 500, with this thickness not being the object of modification by implantation.

b. 2$^{nd}$ Embodiment by Implantation by Plasma: Implantation by Plasma Formed Using a Mixture Comprising a Gaseous Component that Favors the Dissociation of Another Gaseous Component in Order to Form Light Ions Intended to be Implanted in the Protective Layer 500.

In this embodiment, the step of modification of the protective layer 500 is carried out by putting into presence of the protective layer 500 with a plasma formed used a gaseous mixture formed of at least one first non-carbon gaseous component of which the dissociation generates the light ions and a second gaseous component comprising at least one species favoring the dissociation of the first component in order to form the light ions.

The adding of a second component that acts advantageously as a dissociation gas (such as argon, helium, xenon, nitrogen), makes it possible to facilitate the dissociation of the first component and in this way, to favor the implantation of said first dissociated component in the protective layer 500, in the form of light ions. The implanted dose is therefore higher without however needing to increase the maximum depth of implantation. Implanting the underlying layers such as the active layer 103 is as such avoided. Moreover, it is possible to remove a portion of the thickness of the protective layer 500 on the flanks 310 while still precisely controlling the thickness that is retained.

It is therefore important to find the correct ratio between the content of the first component and of the second component in the plasma intended to modify the protective layer 500. Advantageously, the gas ratio between the first component and the second component is greater than 1:19 and less than 19:1.

A lower ratio, which would be the case if the flow rate of the first gas was reduced, would have the consequence of limiting the effectiveness of the modification of the dielectric film.

A higher ratio, which would be the case if the flow rate of the first gas was increased, would have the consequence of limiting the effectiveness of the second gas in terms of dissociation.

Preferably, said ratio is between 1:9 and 9:1.

In this patent application a ratio between two gaseous components is a ratio concerning the respective flow rates of the introduction of the components into the enclosure of the plasma, typically in the plasma reactor. Each flow rate is usually measured in sccm. Typically a flow rate is measured with a flow meter associated with the reactor.

It was problematic to target a threshold depth of selectivity of the protective layer 500 that is equal to the depth of implantation. From this, two problems then arise: either the etching of the modified protective layer 550 is incomplete which requires repeated steps of etching until the desired depth is obtained, or the implantation carried out in the protective layer 500 extends beyond the protective layer 500 therefore resulting in an alteration by implantation of the underlying layer such as the active layer 103.

As such, this embodiment is based in particular on the fact that the second component that forms the plasma is able to act as a dissociation gas with regards to the first component, advantageously with a hydrogen base. By favoring the dissociation of the first component, which is hydrogen, the density of hydrogen ions in the gaseous phase is increased. As such, for the same implantation energy, the density of hydrogen contained in the protective layer 500 by using the method according to this embodiment is greater than that obtained using a plasma that contains only hydrogen (H2).

Moreover, and particularly advantageously, the consumption of the modified protective layer 550 by a cleaning with a base of hydrofluoric acid, for example, is close to the depth of the ion implantation in said modified protective layer 550. As such, by controlling the depth of implantation in the protective layer 500, it is possible to estimate with better precision the thickness of the modified protective layer 550 that will be etched after implantation.

Optionally, the method can furthermore have at least one of any of, the characteristics and steps hereinbelow.

According to a preferred embodiment, the first component is chosen from hydrogen ($H_2$), silicon nitride ($SiH_4$), hydrogen nitride ($NH_3$) or hydrogen bromide (HBr).

According to a preferred embodiment, the second component is chosen from helium (He), nitrogen ($N_2$), argon (Ar) or xenon (Xe).

Advantageously, the flow rate of the first component is between 10 and 1000 sccm (cubic centimeters per minute). Advantageously, the flow rate of the second component is between 10 and 1000 sccm.

Preferentially, the step of modification of the protective layer 500 is carried out in such a way as to provide a polarization power or source power, at a frequency between 100 Hz (Hertz) and 5 kHz, with an operating cycle between 10% and 90%.

For each one of the embodiments mentioned hereinabove and based on an implantation by plasma, the light ions include ions with a base of hydrogen (H2) taken from: H, H+, $H_2^+$, $H_3^+$. According to another embodiment, the light ions include ions with a base of helium (He) or with a base of helium and hydrogen.

For each one of the embodiments mentioned hereinabove and based on an implantation by plasma, the protective layer 500 is preferentially a layer with a base of nitride such as a layer of silicon nitride.

In another embodiment, the protective layer 500 has or comprises a material that has a dielectric constant less than 7 and more preferably than 4 and preferably less than 3.1 and more preferably, less than or equal to 2, which as such makes it possible to reduce the parasite capacity in order to possibly improve the performance of the transistor. For example, the material of the protective layer is taken from among: SiCO, SiC, SiCN, SiOCN, SiCBN, SiCBO, SiOCH, cBN (cubic boron nitride) and $SiO_2$.

This makes it possible to reduce the parasite capacity and to consequently improve the performance of the transistor.

Each one of these materials can be porous or non-porous.

The characteristics and advantages of all of the embodiments indicated hereinabove in order to carry out the anisotropic modification of the protective layer 500, also apply to the isotropic modification of the protective layer 500.

More preferably the isotropic modification will be carried out with the same equipment as the anisotropic modification in order to simplify the method and reduce the costs.

Preferably, for these various embodiments based on an implantation by plasma, the following parameters will be adjusted in order to obtain an anisotropic implantation and over a precise depth that corresponds to the entire thickness of the protective layer 500.

These parameters are in particular:
the pressure inside the chamber of the plasma reactor. Preferably, this pressure is less than 100 milli Torr, and this so as to prevent an isotropic implantation;
the temperature will be preferably less than 100° C. so as to effectively modify the protective layer 500.

For all of these embodiments, the conditions of implantation can be determined by simulation using a SRIM or TRIM tool.

As such a the end of this step of anisotropic modification, the protective layer 500 is modified over all of the faces of the stacks 200, 200', in particular the flanks thereof 210, on the top 320 of the stacks 300'. 300 and between the stacks 200, 200', 300, 300'. Certain surfaces, in particular those of the stacks 200, 200', were as such modified during the isotropic implantation 400 and during the anisotropic implantation 450.

The protective layer 500 is not modified, or at the least is not modified over the entire thickness thereof, on flanks 310 of the stacks 300, 300'.

FIG. 7 shows the result of the step of selective etching of the modified portions 550 of the protective layer 500 with regards to non-modified portions 510.

For each one of the embodiments mentioned hereinabove and based on an implantation by plasma, several alternative embodiments for the selective removal of the modified portions 550 of the protective layer 500 are possible.

The dry or wet etching chemistries mentioned can be used.

According to an embodiment, the step of removing the modified protective layer 550 is carried out by wet etching that is selective to said semiconductor material. If the semiconductor material is silicon, then the step of removing of the modified protective layer 550 is carried out by wet etching selectively to the silicon (Si) and/or to silicon oxide ($SiO_2$) of the insulating trenches 800.

Preferably, the selective etching to silicon is obtained using a solution with a base of hydrofluoric acid (HF) or using a solution with a base of phosphoric acid ($H_3PO_4$).

By way of example with a solution with a base of hydrofluoric acid (HF), the ratio of the etching speed between modified SiN and SiN is about 30; by way of example, the ratio of the etching speed between modified SiN and $SiO_2$ is about 38.

This makes it possible to entirely remove the modified protective layer 550 without consuming the non-modified protective layer 510 on the flanks 310; the active layer 103; the trenches 800.

The performance of the transistors is as such preserved.

The semiconductor material can also be germanium (Ge) or silicon-germanium (SiGe).

According to another embodiment, the step of removal is carried out by wet etching that is selective to said semiconductor material. Preferably, the step of removing the modified protective layer 550, typically made of silicon nitride, is carried out by dry etching selective to silicon (Si) and/or to silicon oxide ($SiO_2$). According to an embodiment, the dry etching is carried out in a plasma formed in a confined enclosure using nitrogen trifluoride ($NF_3$) and ammonia ($NH_3$).

Advantageously, the dry etching comprises: a step of etching consisting in the formation of solid salts; a step of sublimation of the solid species. This embodiment makes it possible to obtain very good selectivity of the etching of the modified nitride in relation to non-modified nitride and to the no-modified semiconductor material. In particular, this etching selectivity is much higher (typically by a factor of at least 10) than that obtained with a solution of HF.

According to another embodiment, the step of removing the modified portions 550 of the first modified protective layer 500 with respect to the non-modified first protective layer 500 comprises a dry etching carried out by putting into presence a gaseous mixture, more preferably only gaseous, comprising at least one first component with a base of hydrofluoric acid (HF). The hydrofluoric acid transforms into non-volatile residues, more preferably non-volatiles at ambient temperature, the modified portions 550 of the first protective layer 500.

Advantageously, the step of removing the modified portions 550 of the first protective layer 500 comprises, only after the dry etching, a removal of the non-volatile residues at ambient temperature by a wet cleaning or a sublimation thermal annealing.

Particularly advantageously, this invention allows for a selective etching of the modified portions 550 of the first protective layer 500 with respect to a layer with a base of silicon oxide. The range of variation in the parameters of the gaseous HF method, making it possible to obtain a selectivity of the modified portions 550 of the first protective layer 500, for example with a base of silicon nitride (SiN) in relation to the first non-modified protective layer 500, is more extended.

An advantage of this invention is that the putting, into presence can be carried out in a simple chemical reactor: a hermetic enclosure wherein the reactants are introduced and which operates either at ambient temperature and atmospheric pressure or at a temperature that is higher than the ambient temperature and at a pressure less than atmospheric pressure. The putting into presence is therefore advantageously not carried out in a plasma reactor of which the equipment and the management is more complex than a chemical reactor. As such, the gaseous HF is simple to implement compared to a plasma. Indeed, a simple chemical reactor, possibly regulated in pressure and temperature, suffices. In the case of a plasma, RF generators and working at a much lower pressure are required, therefore the equipment in this case would be clearly more complex.

Advantageously, the thermal annealing and the HF etching are carried out during successive steps and not simultaneously. This makes it possible to prevent the temperature that is required for annealing from being detrimental to the adsorption of the HF on the surface of the wafer, which would be detrimental to the unfolding of the reaction between gaseous HF and the modified portions 550 of the first protective layer 500, for example with a base of SiN.

Particularly advantageously, this embodiment allows not only for the control of the damage that could be generated following an ion implantation, but also an improvement in the removal of the modified portions 550 of the first protective layer 500, by proposing a method that has better etching selectivity between the modified portions 550 of the first protective layer 500 and the first non-modified protective layer 500 on the one hand, between the modified portions 550 of the first protective layer 500 and the layer of silicon oxide and between the modified portions 550 of the first protective layer 500 and the layer made of a semiconductor material, on the other hand. Advantageously, the selectivity of the gaseous HF method between the modified dielectric layer and the layer of semiconductor material is infinite (in other words, the gaseous HF does not etch the semiconductor material).

Advantageously, this embodiment proposes an infinite selectivity of the modified portions 550 of the first protective layer 500. As such, this embodiment allows for better control of the critical dimensions. The method according to this embodiment furthermore allows for a selective etching of the modified portions 550 of the first protective layer 500 with regards to the other non-modified layers for example, avoiding any risk of consuming all or a portion of a layer with a base of silicon nitride or a layer with a base of silicon oxide such as that forming the insulating trenches 800.

In this embodiment, the method is carried out sequentially. The etching, advantageously "dry", of the modified portions 550 of the first protective layer 500, for example of silicon nitride (SiN), is carried out using pure gaseous hydrofluoric acid (no co-injection of alcohol). At the end of the dry etching, non-volatile residues at ambient temperature (for example, in the form of salts) are present on modified portions 550 of the first protective layer 500.

The term "salt" means a solid ionic compound formed of an anion and of a cation but of which the overall electrical charge is neutral.

According to a first embodiment, the non-volatile etching residues can then be eliminated by carrying out a simple cleaning with water. According to another preferred but not limiting embodiment, in order to eliminate the non-volatile residues on the surface of the modified portions 550 of the first protective layer 500, an annealing is carried out after the "dry" etching of the modified portions 550 of the first protective layer 500. This annealing makes it possible to sublime the non-volatile residues at ambient temperature, typically solid salts This method can be used, for example, as a replacement for "wet" cleaning, for example with a base of water. Advantageously, this alternative method (pure gaseous HF followed by an annealing) proposes an entirely "dry" method (which contains no steps in the liquid phase), which can be interesting to eliminate the known problems caused during "wet" etchings carried out for the forming of patterns, for example.

According to an advantageous embodiment, a step of pre-annealing is carried out before the dry etching with a base of gaseous hydrofluoric acid. This makes it possible to eliminate the humidity that is naturally adsorbed on substrates and as such avoids introducing water, which is a proton acceptor, inside the treatment chamber of the etcher; said chamber comprising hydrofluoric acid (HF). As such the step of pre-annealing makes it possible to further increase the selectivity between a modified layer of silicon nitride (SiN) and a layer of silicon oxide (SiO2).

Particularly advantageously, no etching of a layer of silicon oxide (SiO2) can take place since the method of etching a layer with a base of silicon oxide operates only with the simultaneous presence of hydrofluoric acid and of proton acceptor groups (such as alcohol, water). It is therefore through the absence of putting into the simultaneous presence of hydrofluoric acid and of proton acceptor groups, that a great selectivity is obtained between a modified layer of silicon nitride (SiN) and a layer of silicon oxide (SiO2). This sequential process also shows great selectivity between a non-modified layer of silicon nitride (SiN) and a modified layer of silicon nitride.

Particularly advantageously, the sequential method according to this embodiment offers better etching selectivity of the modified protective layer with regards to silicon (Si) and silicon-germanium (SiGe). This method also has better etching selectivity with regards to the silicon oxide (SiO2) forming for example the hard mask or the insulating trenches 800 or non-modified silicon nitride (SiN), in particular thanks to the absence of proton acceptor groups by using a method with a base of pure gaseous hydrofluoric acid. Other known solutions for removing a modified layer of silicon nitride SiN such as hydrofluoric acid (HF) in the liquid phase or phosphoric acid (H3PO4) do not allow for such selectivity to, respectively, silicon oxide (SiO2) or non-modified silicon nitride (SiN).

Advantageously, the parameters of the step of removing the modified portions 550 of the first protective layer 500, in particular the gas ratio between the first component and the second component used during dry etching, are provided in such a way that the modified portions 550 of the first protective layer 500 can be etched selectively with regards to the layer made of a semiconductor material and with regards to the first non-modified protective layer 500 and, advantageously, with respect to the layer made of silicon oxide. It is therefore important to find the correct ratio between the content in the first component and of the second component during the dry etching intended to remove the modified portions 550 of the first protective layer 500.

Advantageously, the gas ratio between the first component (for example, gaseous HF) and the second component (for example, pure N2) is between 1:25 and 1:1.

A lower ratio, which would be the case if the flow rate of the first component were reduced, would have the consequence of limiting the effectiveness of the etching of the modified portions 550 of the first protective layer 500. A higher ratio, which would be the case if the flow rate of the first component were increased, would have the consequence of limiting the selectivity with regards to the layer made of non-modified silicon nitride and with respect to the layer made of silicon oxide. In this patent application, the term ratio between two gaseous components, means a ratio concerning the respective flow rates of the introduction of the components into the enclosure of the chemical reactor (during the use of gaseous HF). Each flow rate is usually measured in cubic centimeters per minute (sccm). Typically a flow rate is measured with a flow meter associated with each flow of gas entering the reactor.

Advantageously, the dry etching consumes the modified portions 550 of the first protective layer 500 preferentially to the layer made of a semiconductor material and to the first non-modified protective layer 500. As such, the risk of excessive consumption of the superficial layer of semiconductor material is reduced, and even suppressed.

Figure 8:
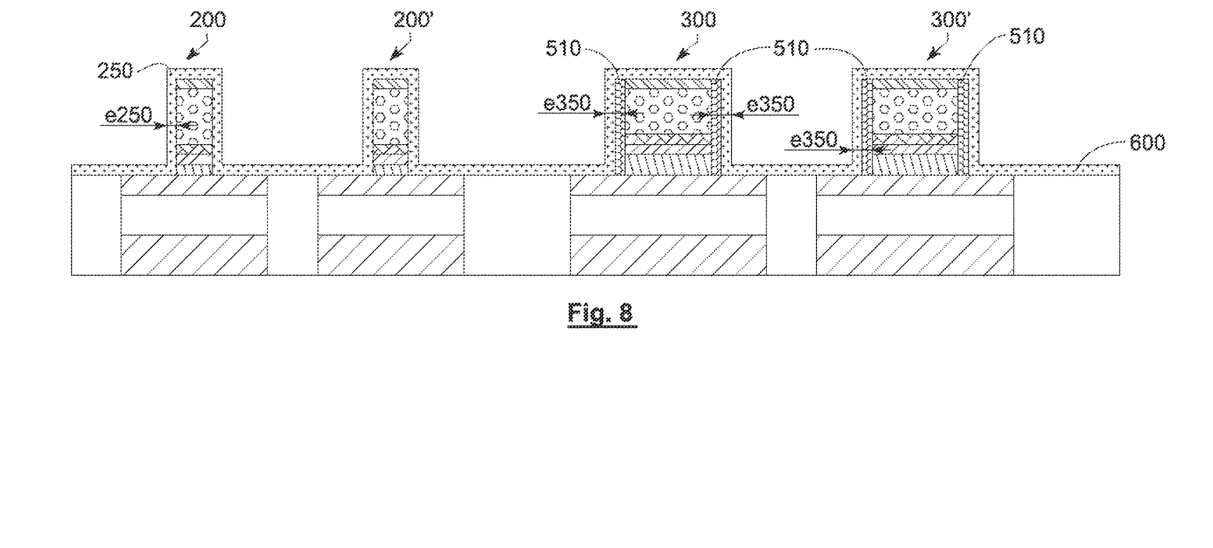

The step shown in FIG. 8 comprises the deposition of a second conformal protective layer 600 on all of the stacks 200, 200', 300, 300'. This second protective layer 600, made of a dielectric, can be single-layer or not. Its purpose is to form a spacer 610 on each one of the flanks 210 of the stacks 200, 200' and of the flanks 310 of the stacks 300, 300'.

As such, at this stage, on each one of the flanks 210 of the stacks 200, 200', a spacer 250 is formed and has a thickness "e 250" referenced in FIG. 8. This thickness corresponds to the thickness of the second protective layer 600. On each one of the flanks 310 of the stacks 300, 300', is formed a spacer 350 that will have a thickness "e 350" corresponding to the sum of the thicknesses of the non-modified portions 510 of the first protective layer 500 and to the thickness of the second protective layer 600.

Preferably, the second protective layer 600 is a material taken from those mentioned hereinabove for the protective layer 500. It can be porous or non-porous. It can be made of a material that is identical to or different from that of the protective layer 500.

Figure 9:
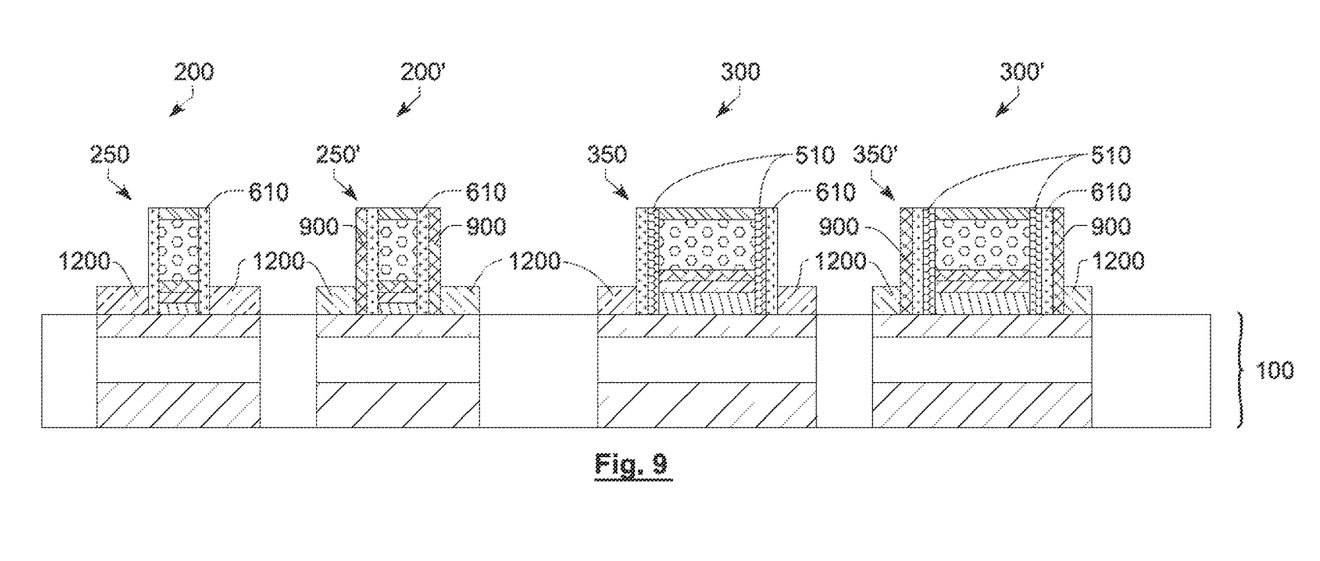

An optional step not shown can consist in forming spacers 900 on the flanks of the stacks 200' and 300', i.e. of the PFET type in this example. These spacers 900 are shown in FIG. 9. They are produced like the spacers 610, via deposition of a third conformal protective layer, then removal of this layer outside of the flanks of these stacks 200', 300'.

In this case:
the spacers 250 of the NFET transistors, of which the gate oxide insulating layer 201 is thin, are formed by a portion 610 at least of the second protective layer 600;
the spacers 250' of the PFET transistors, of which the gate oxide insulating layer 201 is thin, are formed by a portion 610 at least of the second protective layer 600 and a portion 900 of the third protective layer;
the spacers 350 of the NFET transistors, of which the gate oxide insulating layer 301 is thick, are formed by a portion 610 at least of the second protective layer 600 and by a portion 510 at least of the first protective layer 500.
the spacers 350' of the PFET transistors, of which the gate oxide insulating layer 301 is thick, are formed by a portion 610 at least of the second protective layer 600 and by a portion 510 at least of the first protective layer 500 and by a portion 900 at least of the third protective layer 900.

It is then possible to implement other steps in order to finalize the production of the transistors.

Among these conventional steps, it is possible to provide the removal of the second layer 600 on the tops 220, 320 of the stacks 200, 200', 300, 300' and between these stacks in order to retain portions 510, 610 of these layers 500 and 600 only on the flanks 210, 310 of the stacks 200, 200', 300, 300'.

Another step concerns the growth of the source and drain 1200 via epitaxy from the active layer 103 as shown in FIG. 9.

In light of the preceding description, it clearly appears that the method according to the invention makes it possible to improve the service life of the devices that integrate on the same chip transistors of which the gate thicknesses are different, without however substantially increasing the complexity of the method of manufacturing.

The invention is not limited to the embodiments described hereinabove and extends to all of the embodiments covered by the claims.

Figure 10:
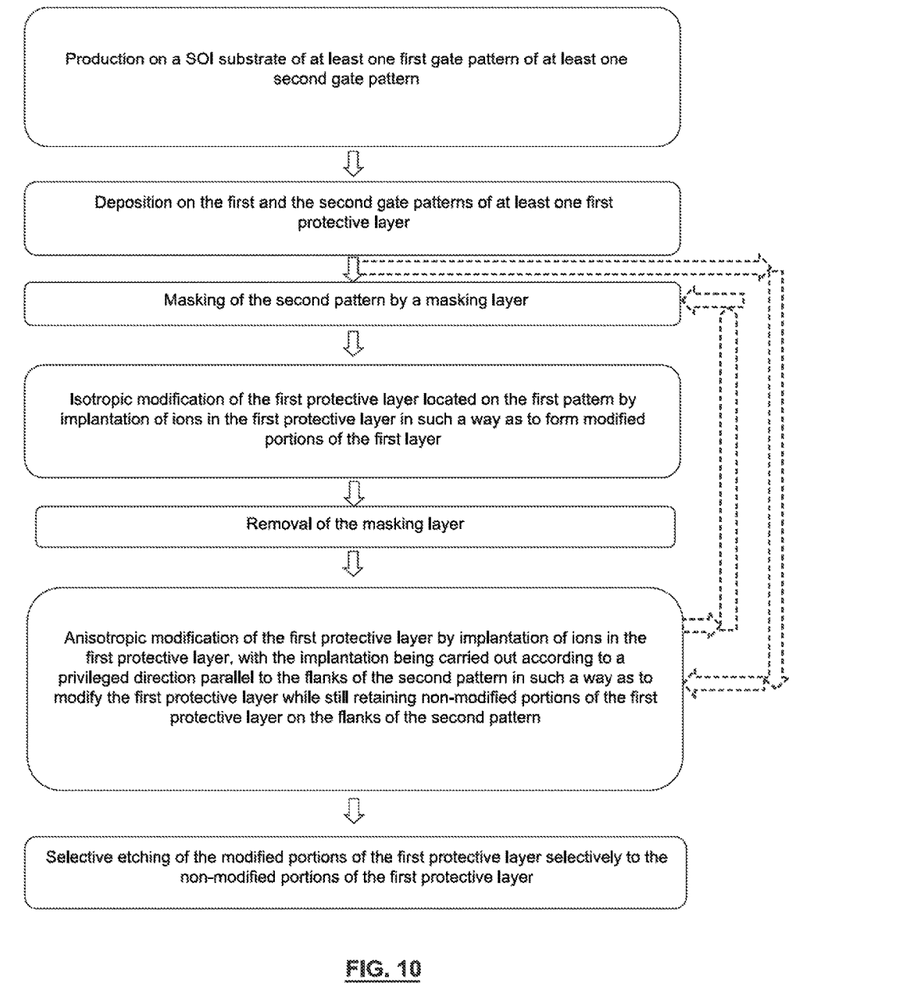
FIG. 10 summarizes certain steps of two examples of the method according to the invention.

For example the order of certain steps can be inversed. In particular, the step of anisotropic implantation 450 of the first protective layer 500 can be carried out before the step of masking of the second stacks 300, 300'. According to this alternative embodiment, once the step of anisotropic implantation 450 of the first protective layer 500 is carried out, the step of masking of the second stacks 300, 300' is then carried out, then the step of isotropic modification 400.

This alternative embodiment is shown in FIG. 10 by the arrows as a dotted line.

The details, examples and advantages of the steps of the embodiment described in detail in reference to the FIGS. 1 to 9 apply to this alternative embodiment wherein the step of anisotropic etching 450 of the first protective layer 500 is carried out before the masking of the second stack 300.

The invention also covers the case where the modified portions 550 are etched of the first protective layer with respect to the non-modified portions 510 of the first protective layer 500 at the end of each step of modification 400 and 450.

However, the embodiments described hereinabove with a single step of selective etching carried out at the end of the two implantations (isotropic 400 and anisotropic 450) are advantageous in terms of cost and simplification of the method.

Although the invention is particularly advantageous for producing on the same substrate transistors of which the gate stacks have insulating layers (typically a gate oxide layer) of different thicknesses, this is not limiting. Indeed the invention also applies to the production on the same substrate of transistors of which the gate stacks have insulating layers of identical thicknesses.

Moreover, in the embodiments shown, the gate stack is carried out prior to the steps of the invention. These figures show as such a method of the gate first type.

According to another embodiment covered by the invention, the functional gate stack is carried out after the steps of the invention. The gate stack whereon is deposited the first protective layer therefore forms a sacrificial pattern which will be removed, once the spacers are produced. This alternative embodiment is as such a method of the gate last type.

REFERENCES

100 Developed substrate
101 Carrier layer
102 Dielectric layer
103 Active layer
200 First stack/Pattern
201 Insulating layer of the first stack
202 Layer with high permittivity of the first stack
203 Metal gate of the first stack
204 Gate of the first stack
205 Hard mask of the first stack
210 Flank of the first stack
220 Top of the first stack
250 Spacer of the first stack
300 Second stack/Motif
301 Insulating layer of the second stack
302 Layer with high permittivity of the second stack
303 Metal gate of the second stack
304 Gate of the second stack
305 Hard mask of the second stack
306 Cavity
310 Flank of the second stack
320 Top of the second stack
350 Spacer of the second stack
400 Isotropic implantation
450 Anisotropic implantation
500 First protective layer
510 Non-modified portion of the first protective layer
550 Modified portion of the first protective layer
600 Second protective layer
610 Portion of second protective layer
700 Masking layer
800 Insulating trenches
900 Third protective layer
1200 Source/Drain

The invention claimed is:
1. A method for producing at least one first transistor and at least one second transistor on a same substrate, the method comprising:
producing, on the substrate, at least one first gate pattern and at least one second gate pattern;
depositing at least one first protective layer on the first and the second gate patterns;
masking the second gate pattern by a masking layer;

performing, after the masking, isotropic modification of the first protective layer disposed on the first gate pattern by isotropic implantation of ions in the first protective layer so as to forth modified portions of the first protective layer;

removing the masking layer;

performing, before the masking or after the removing of the masking layer, anisotropic modification of the first protective layer by anisotropic implantation of ions in the first protective layer, the anisotropic implantation being carried out in a direction parallel to flanks of the second gate pattern so as to modify portions of the first protective layer at on a top of the second gate pattern and outside of the first and second gate patterns while retaining unmodified portions of the first protective layer on the flanks of the second gate pattern; and performing selective etching of the modified portions of the first protective layer relative to the unmodified portions of the first protective layer.

2. The method according to claim 1,
wherein the first gate pattern is a first gate stack,
wherein the second gate pattern is a second gate stack, and
wherein each one of the first and second gate stacks comprises at least one insulating layer.

3. The method according to claim 2, wherein a thickness of the insulating layer of the second stack is greater than a thickness of the insulating layer of the first stack.

4. The method according to claim 3,
wherein the thickness of the insulating layer of the first stack is between 0 nm and 3 nm, and
wherein the thickness of the insulating layer of the second stack is between 1.5 nm and 8 nm.

5. The method according to claim 1,
wherein the first gate pattern is a first sacrificial pattern,
wherein the second gate pattern is a second sacrificial pattern, and
the method further comprising, after the selective etching of the modified portions, replacing the first and second sacrificial patterns with patterns respectively forming a first gate stack and a second gate stack,
wherein each one of the first and second gate stacks comprises at least one insulating layer.

6. The method according to claim 1, further comprising, after the selective etching, forming at least one additional layer on the flanks of the first and second gate patterns.

7. The method according to claim 1, wherein the anisotropic modification is performed before the masking.

8. The method according to claim 1, wherein the anisotropic modification is performed after the removing of the masking layer.

9. The method according to claim 1,
wherein the substrate comprises an active layer disposed under the first and second gate patterns, and
wherein the selective etching is performed so as to selectively etch the modified portions of the first protective layer relative to the active layer.

10. The method according to claim 1,
wherein the first protective layer is made of a nitride, or
wherein the first protective layer is made of a material of which a dielectric constant is less than 7, the material being chosen from among a material with a base of carbon (C), SiCO, SiC, SiCN, SiOCN, SiCBN, SiOCH, CBN, BN, SiCBO, and $SiO_2$.

11. The method according to claim 1, wherein the isotropic modification is performed using an implanter and by modifying a direction of ion bombardment during the implantation.

12. The method according to claim 1, wherein the isotropic modification is performed by isotropic implantation of ions coining from a plasma.

13. The method according to claim 12,
wherein the ions isotropically implanted are helium ions or are ions with a hydrogen base, and
wherein, during the isotropic modification, a pressure greater than 100 milli Torr is maintained.

14. The method according to claim 1, wherein the anisotropic modification is performed using an implanter and by retaining a substantially constant direction of bombardment during the implantation, the direction being substantially parallel to the flanks of the second gate pattern.

15. The method according to claim 1,
wherein the anisotropic modification is performed by anisotropic implantation of ions coming from a plasma,
wherein the implanted ions are helium ions or are ions with a base of hydrogen, and
wherein, during the anisotropic modification, a pressure less than 100 milli Torr is maintained.

16. The method according to claim 15, wherein the anisotropic modification further comprises:
putting the protective layer into presence of a plasma formed used a gaseous mixture formed of at least one first non-carbon gaseous component of which dissociation generates light ions and a second gaseous component comprising at least one species favoring dissociation of the first non-carbon gaseous component so as to form the light ions,
wherein a gas ratio of the first ion-carbon gaseous component to the second gaseous component is greater than 1:19 and less than 19:1.

17. The method according to claim 1, wherein the selective etching is a wet etching using a solution with a base of hydrofluoric acid (HF) or using a solution with a base of phosphoric acid ($H_3PO_4$).

18. The method according to claim 1,
wherein the selective etching is a dry etching performed in a plasma formed using nitrogen trifluoride ($NF_3$) and ammonia ($NH_3$), and
wherein the selective dry etching comprises etching forming solid salts and sublimating a solid species.

19. The method according to claim 1, wherein the selective etching comprises:
a dry etching performed by putting the modified portions of the first protective layer into presence of a gaseous mixture comprising at least one first component with a base of hydrofluoric acid (HF), with the hydrofluoric acid transforming the modified portions of the first protective layer into non-volatile residue at ambient temperature; and
removing only after the dry etching, the non-volatile residue by a wet cleaning or by sublimation thermal annealing.

* * * * *